(12) United States Patent
Maximovsky et al.

(10) Patent No.: US 8,206,505 B2
(45) Date of Patent: Jun. 26, 2012

(54) METHOD FOR FORMING NANO-DIMENSIONAL CLUSTERS AND SETTING ORDERED STRUCTURES THEREFROM

(76) Inventors: Sergei Nikolaevich Maximovsky, Moscow (RU); Grigory Avramovich Radutsky, Moscow (RU)

( * ) Notice: Subject to any disclaimer, the term of this patent is extended or adjusted under 35 U.S.C. 154(b) by 957 days.

(21) Appl. No.: 12/095,309

(22) PCT Filed: Nov. 29, 2005

(86) PCT No.: PCT/RU2005/000514
§ 371 (c)(1),
(2), (4) Date: Sep. 12, 2008

(87) PCT Pub. No.: WO2007/064237
PCT Pub. Date: Jun. 7, 2007

(65) Prior Publication Data
US 2009/0008833 A1   Jan. 8, 2009

(51) Int. Cl.
*C30B 7/14* (2006.01)
(52) U.S. Cl. ............ 117/68; 117/69; 264/482; 977/700; 977/701; 977/712; 977/720; 977/721; 977/722; 977/723; 977/762; 977/763; 977/764; 977/765; 977/773; 977/774; 977/775; 977/776; 977/777
(58) Field of Classification Search .............. 117/68–69, 117/87–92, 94, 97, 103–105, 108, 902, 904, 117/921; 264/482; 977/700–701, 712, 720–723, 977/762–765, 773–777
See application file for complete search history.

(56) References Cited

U.S. PATENT DOCUMENTS

| 6,068,800 A * | 5/2000 | Singh et al. .................. 264/8 |
| 6,419,998 B1 * | 7/2002 | McGrath ..................... 427/596 |
| 2004/0137710 A1 * | 7/2004 | Grigoropoulos et al. ..... 438/622 |

FOREIGN PATENT DOCUMENTS

| DE | 10006905 A1 | 9/2001 |
| RU | 2214359 C1 | 10/2003 |
| WO | 0138940 A2 | 5/2001 |

OTHER PUBLICATIONS

Survey Report from the Applied Research Laboratory at the Pennsylvania State University entitled "Information: Laser-Liquid-Solid Interaction Technique" originally published Mar. 8, 1999.*
Bogomolov et al. "A crystalline (amorphous) silicon bubble 3-D lattice in a synthetic opal matrix" Microscopy of Semiconducting Materials 1999 Proceedings of the Institute of Physics Conference held at Oxford University, Mar. 22-25, 1999 Institute of Physics Conference Series No. 164, pp. 533-536.

* cited by examiner

*Primary Examiner* — Michael Kornakov
*Assistant Examiner* — Kenneth A Bratland, Jr.
(74) *Attorney, Agent, or Firm* — Volpe and Koenig, P.C.

(57) ABSTRACT

The inventive method for forming nano-dimensional clusters consists in introducing a solution containing a cluster-forming material into nano-pores of natural or artificial origin contained in a substrate material and in subsequently exposing said solution to a laser radiation pulse in such a way that a low-temperature plasma producing a gaseous medium in the domain of the existence thereof, wherein a cluster material is returned to a pure material by the crystallization thereof on a liquid substrate while the plasma is cooling, occurs, thereby forming mono-crystal quantum dots spliced with the substrate material. Said method makes it possible to form two- or three-dimensional cluster lattices and clusters spliced with each other from different materials. The invention also makes it possible to produce wires from different materials in the substrate nano-cavities and the quantum dots from the solution micro-drops distributed through an organic material applied to a glass.

8 Claims, 2 Drawing Sheets

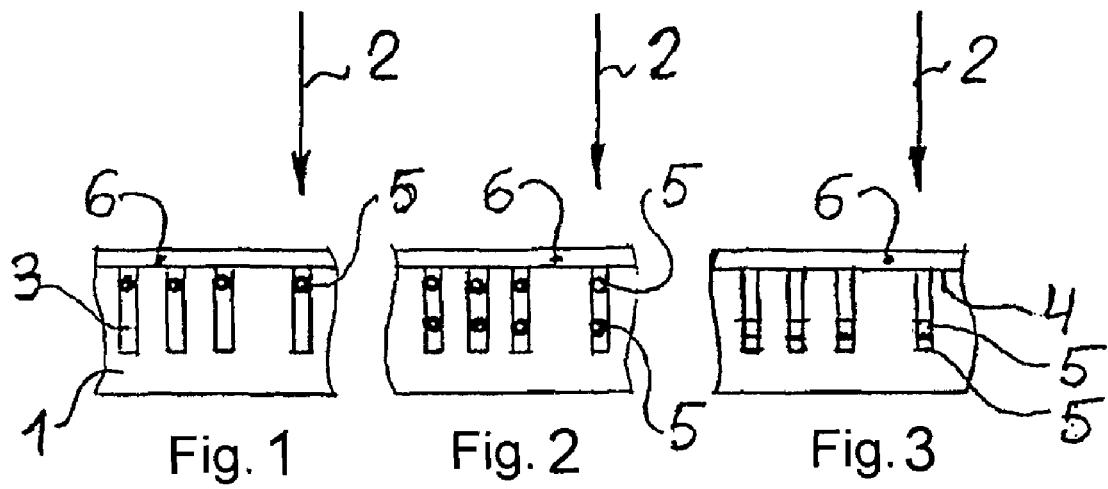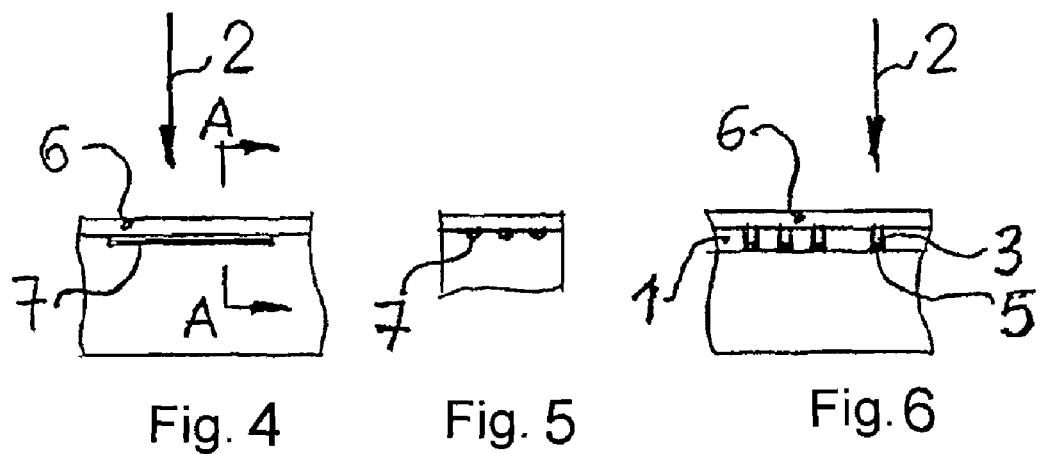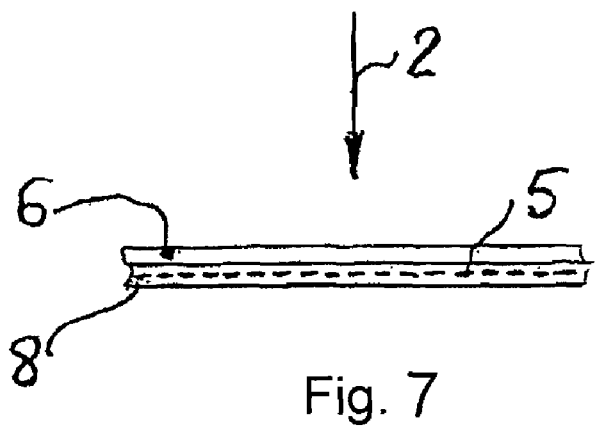

METHOD FOR FORMING NANO-DIMENSIONAL CLUSTERS AND SETTING ORDERED STRUCTURES THEREFROM

The present invention relates to electronics and more particularly, to the technology of forming nano-dimensional clusters and setting therefrom nanoelectronic structures used for transmission, conversion, storage and generation of information signals.

PRIOR ART

A method for forming nano-dimensional clusters and setting nanoelectronic structures therefrom is known which consists in that appropriate substances are introduces into nano-dimensional cavities existing in the structure of some natural or artificial materials (see, for instance, the theses of papers read at the XI International Conference on Semiconducting Materials, held on Mar. 22 to 25, 1999 at Oxford—"A crystalline (amorphous) silicon 3-D bubble lattice in a synthetic opal matrix", V. N. Bogomolov, et al.).

In accordance with this method, the voids in synthetic opal are filled up under pressure with a melt or solution of tellurium to obtain thereby a lattice of tellurium nano-clusters in an opal matrix.

However, it is difficult to ensure setting a lattice of isolated clusters by this method because of a network of channels connecting the nano-pores with each other.

It is also impossible to set, by this method, a three-dimensional structure from isolated clusters arranged in the nano-pores in the different layers of a substrate. Besides, the clusters produced by this method are arranged in an random manner, like also the nano-dimensional cavities in the body of opal; hence, it is impossible to set discrete nano-elements that are homogeneous in their electrical and optical properties and organize them into an ordered structure.

Known in prior art is a method for forming a lattice of nano-clusters and setting a two-dimensional lattice therefrom (see, for instance, RF Patent No. 2214359, IPC[7]: B 8 2B 3/00).

The known method allows to form clusters that are homogeneous in their sizes, and arranging them with the same pitch at the nodes of a two-dimensional lattice.

However, this method is technologically complicated, shows low efficiency and does not allow to set a three-dimensional lattice.

Also, known in prior art is a method for forming a metallized image of predetermined topology on a sheet material (see, for instance, PCT publication No. WO 01/38940 A2, IPC: G03F 7/26). In accordance with this method, metal particles are moved from a layer positioned on a glass plate above the sheet material and deposited down thereon under the action of laser radiation pulses.

However, it is impossible to provide, by this method, clusters or wires on the sheet material in connection with a large size of the particles thus moved over thereto.

DISCLOSURE OF THE INVENTION

The invention is aimed at providing such a method for forming nano-dimensional clusters and setting ordered structures therefrom, which would allow forming clusters both on the surface of a substrate and in the body thereof at a predetermined depth and set three-dimensional structures from the clusters.

The object thus aimed at is attained owing to that, in a method for forming nano-dimensional clusters and setting ordered structures therefrom, said method comprising the steps of: introducing materials to form the clusters therefrom into a substrate of some natural or artificial materials having predetermined physical parameters, and producing composites with controllable properties, in accordance with the invention, the materials for forming the clusters are introduced into the substrate material as components of a solution, whereupon the solution is exposed to the action of laser radiation pulses at predetermined points of the substrate, a low-temperature plasma is thus formed within the zone of a laser spot, and a gaseous medium is produced thereby in the domain of the existence of plasma to be used for reducing the ions of cluster material therein to a pure material so that, while the plasma is cooling down, said clusters are formed as mono-crystal quantum dots and wires spliced with the substrate material.

With this method for forming nano-dimensional clusters and setting structures therefrom, there is no need in complicated and expensive special equipment as well as in extraordinary technologies for introducing the material to form the clusters therefrom into the substrate.

It is advisable to use metals, non-metals and semiconductors as the materials for forming the clusters.

With this method for forming nano-dimensional clusters and setting structures therefrom, conditions are provided for forming the clusters as mono-crystals.

It is advisable to make the substrate of a material that is transparent for the laser radiation of the wavelength thus used and that is chemically inert to the solution at the temperature of its existence, whereas the solution is made up so as to be capable of proper wetting the substrate material, of absorbing the radiation of a predetermined wavelength and also capable of forming atomic hydrogen under the action of the low-temperature plasma thereon.

With this method for forming nano-dimensional clusters and setting structures therefrom, it is made possible to form them inside the substrate.

It is advisable, prior to the action of the laser radiation on the solution thus introduced into the substrate material, to cover the substrate with a material that is transparent for this radiation.

With this method for forming nano-dimensional clusters, a directed action of the laser radiation on the solution is ensured.

It is advisable to introduce the solution into a plurality of nano-pores of natural or artificial origin in the substrate material, focusing a laser beam on a predetermined area of the substrate surface and induce forming the clusters in the openings of those nano-pores that are located within the zone of the laser spot.

With this method for forming nano-dimensional clusters, simultaneous formation of the nano-dimensional clusters takes place in all the nano-pores that fell within the zone of the laser spot.

It is advisable to focus the laser beam at different points of one and the same layer in the body of the substrate so as to cause forming the clusters in the channels of those nano-pores that are located in this layer.

With this method for forming nano-dimensional clusters, it is possible to form them at a predetermined depth in the nano-pores.

It is advisable to form the clusters successively in a number of the substrate layers, beginning from the lowermost one, and set thereby a three-dimensional structure from the clusters, with the nano-pores of the substrate being filled up with the solution in between the steps of forming the clusters in adjacent layers.

With this method for forming nano-dimensional clusters, it is possible to set a spatial three-dimensional structure therefrom.

It is advisable to form the spliced clusters from different materials in each nano-pore, with the nano-pores being filled up with a solution containing a different material after the clusters are formed therein from a first material.

With this method for forming nano-dimensional clusters, it is possible to set a three-dimensional structure from the clusters that are formed from different materials.

It is advisable to place the substrate with through nano-pores on a sheet material, fill up the nano-pores with the solution, acting on the solution by laser radiation pulses and cause thereby forming the clusters on the surface of the sheet material opposite to the outlet openings of the nano-pores.

With this method for forming nano-dimensional clusters, it is possible to set a two-dimensional nano-cluster lattice on the surface of the sheet material.

It is advisable to form on the substrate surface a plurality of extended grooves having each a predetermined topology with a nano-dimensional recess, fill them up with the solution containing the cluster-producing material, acting on each point of the groove by a laser radiation pulse and cause thereby forming the wires within the recesses in the grooves.

With this method for forming nano-dimensional ordered structures, it is possible to form wires of arbitrary topology that are spliced with the substrate material.

It is advisable to produce a finely dispersed mixture from both an organic material of the substrate and the solution, apply it in a uniform layer to a glass, focusing a laser beam on predetermined areas of this layer, cause forming therein the clusters within the laser spot, polymerize the film thus applied to the glass and form a metal-polymer complex.

With this method for forming nano-dimensional clusters, the technology of producing large screens for representation of information is simplified.

BRIEF DESCRIPTION OF THE DRAWINGS

The invention will further be described in detail with reference to the accompanying drawings that show specific embodiments thereof not limiting the present invention, and in which:

FIG. 1 illustrates the inventive method, with a two-dimensional cluster lattice being set in nano-pores of artificial origin;

FIG. 2 illustrates the inventive method, with a three-dimensional cluster lattice being set in nano-pores of artificial origin;

FIG. 3 illustrates the inventive method, with a three-dimensional lattice being set from spliced clusters in nano-pores of artificial origin;

FIG. 4 and FIG. 5 (section A-A in FIG. 4) illustrate the inventive method where wires of predetermined topology are formed on the surface of the substrate so as to be spliced with it;

FIG. 6 illustrates the inventive method, with a two-dimensional nano-cluster lattice being set on the surface of a sheet material;

FIG. 7 illustrates the inventive method, with nano-clusters being formed inside a layer of organic material applied to a glass.

DETAILED DESCRIPTION OF THE PREFERRED EMBODIMENTS

Figure 8:
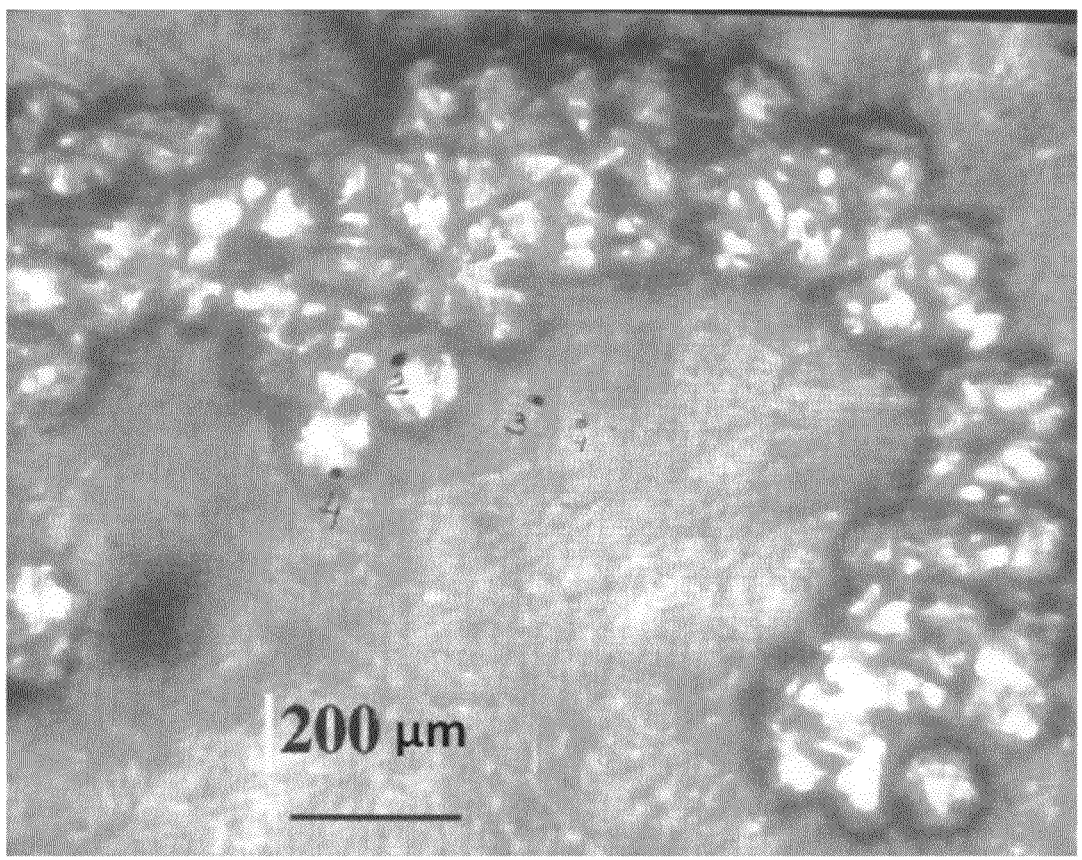
FIG. 8 illustrates copper mono-crystals produced by the inventive method of high-rate crystallization on a liquid substrate.

The inventive method for forming nano-dimensional clusters and setting ordered structures therefrom is accomplished in the following manner.

In a substrate 1 of a material which is transparent for laser radiation 2 of the wavelength thus used, a two-dimensional lattice is made by any known method, in particular by the method of nano-lithography, so that the two-dimensional lattice consists of nano-pores 3 of the same cross-section and a predetermined depth, which are perpendicular to the surface 4 of the substrate.

A solution containing a material for forming clusters 5, for instance, in the form of a salt of this material is introduced into the nano-pores 3. The remainder of this solution is then removed from the surface 4 of the substrate 1, and this surface is covered by a material transparent for laser radiation, for instance, by a glass 6.

A pulse of the laser radiation 2 is directed through the glass 6 at the solution in the nano-pores 3, the pulse power being sufficient for a low-temperature plasma to occur in the solution thus filled up into the nano-pores 3 located within the laser spot and produce a gaseous medium in the area of its existence during the action of the pulse.

The cluster material is recover in this medium to a pure material as a result of its crystallization on a liquid substrate in the atmosphere of atomic hydrogen. This takes place because the composition of the solution is selected in view of forming the atomic hydrogen under the action of the low-temperature plasma thereon.

As a result, the cluster is crystallizing in the protective atmosphere of atomic hydrogen, this allowing it to attain high structural perfection at a low concentration of admixtures and in the absence of processes of its oxidation.

FIG. 8 shows copper mono-crystals produced by the inventive method of high-rate crystallization on the liquid substrate in the protective atmosphere of atomic hydrogen.

Similar processes take place when setting a three-dimensional cluster lattice (FIG. 2). In this case, the clusters a first formed in the lower layer of the substrate, and then the nano-pores are again filled up with the solution to form the clusters in the upper layer of the substrate.

The inventive method allows forming spliced clusters from different materials (FIG. 3) in the body of the substrate. For this purpose, after the clusters are formed in the lower layer of the substrate, the nano-pores are filled up with a solution containing a different material to form the clusters therefrom.

It is also possible to set a two-dimensional cluster lattice by the inventive method on a smooth surface of the sheet material (FIG. 6).

For this purpose, the substrate 1 with through nano-pores 3 is placed on the surface of the sheet material, the solution is introduced into the nano-pores, the substrate 1 is covered with the glass 6, and the process is then repeated as described herein above.

The inventive method allows to obtain wires 7 of any predetermined topology on the surface of the substrate (FIGS. 4 and 5). In this case, the solution is introduced into nano-dimensional grooves, and the process is then repeated as described herein above. Using this method, it is also possible to obtain wires spliced from two materials, as it has been already described herein above for the spliced clusters obtained from different materials.

Using the inventive method, it is possible to form clusters inside an organic material applied in a uniform layer 8 to a glass (FIG. 7). In this case, a finely dispersed mixture is first produced from an organic material of the substrate and the solution to be then applied in a uniform layer to the glass. When the laser radiation pulses act on predetermined sections of this layer, fine bubbles of the solution interact with the laser beam. As a result of the processes thus described herein above, clusters are formed in the layer applied to the glass.

INDUSTRIAL APPLICABILITY

The claimed method for forming nano-dimensional clusters and setting ordered structures therefrom allows to form two- and three-dimensional lattices from mono-crystal quantum dots and wires spliced with the substrate material.

The invention claimed is:

1. A method for forming nano-dimensional clusters and setting ordered structures therefrom, said method comprising the steps of:
    providing a plurality of nanopores in a substrate body of some natural or artificial materials;
    introducing materials in a solution in the nano-pores of the substrate body; selecting a solution capable of forming atomic hydrogen under the action of laser radiation having a predetermined power;
    exposing the solution in the nano-pores to the action of laser radiation pulses of a predetermined power within a laser spot when a laser beam is focused on predetermined sections of the substrate body at a predetermined depth so as to form a low-temperature plasma in the solution in the nano-pores, at the same time forming a protective environment of atomic hydrogen during the action of the laser radiation pulses on predetermined sections of the substrate body at a predetermined depth, and providing formation of nano-dimensional clusters with setting ordered structures with controllable properties in the nano-pores located within the laser spot in predetermined sections of the substrate body at a predetermined depth while the plasma is cooling down.

2. The method according to claim 1, wherein metals, metalloids and semiconductors are used as the materials for forming the nano-dimensional clusters.

3. The method according to claim 1, wherein the ordered structures of nano-dimensional clusters are formed successively in several layers of substrate body in the nano-pores, beginning from a lowermost layer of the substrate body, and a two-dimensional or a three-dimensional structure of nano-dimensional clusters is formed in the nano-pores at different depths of the substrate body.

4. The method according to claim 1, wherein affixed nano-dimensional clusters are formed from different materials in each nano-pore, with the nano-pores being filled up with a solution containing a different material after the nano-dimensional clusters are formed therein from a first material.

5. The method according to claim 1, wherein the substrate with through nano-pores is placed on a sheet material, nano-pores are filled up with the solution, the solution is acted on by laser radiation pulses and formation nano-dimensional clusters on the surface of the sheet material opposite to the outlet openings of the nano-pores is caused thereby.

6. A method for forming nano-dimensional clusters and setting ordered structures therefrom, said method comprising the steps of:
    providing a plurality of nano-dimensional extended grooves of a predetermined topology with a predetermined nano-dimensional recess on a surface of a substrate body of some natural or artificial materials;
    introducing materials in a solution in the nano-dimensional extended grooves of the substrate body;
    selecting a solution capable of forming atomic hydrogen under the action of laser radiation having a predetermined power;
    exposing the solution in the nano-dimensional extended grooves to the action of laser radiation pulses of a predetermined power within a laser spot when a laser beam is focused on predetermined sections of the substrate body so as to form a low-temperature plasma in the solution in the nano-dimensional extended grooves, at the same time forming a protective environment of atomic hydrogen during the action of the laser radiation pulses on predetermined sections of the substrate body; and providing formation of nano-dimensional clusters with setting ordered structures with controllable properties in the nano-dimensional grooves located within the laser spot in predetermined sections of the substrate body while the plasma is cooling down.

7. The method according to claim 6, wherein metals, metalloids and semiconductors are used as the materials for forming the nano-dimensional clusters.

8. The method according to claim 6, wherein the nano-dimensional clusters in the form of ordered structures are wires formed in recesses of the nano-dimensional extended grooves.

* * * * *